United States Patent
Parker et al.

(10) Patent No.: US 10,859,911 B2
(45) Date of Patent: Dec. 8, 2020

(54) MULTI-TONE AMPLITUDE PHOTOMASK

(71) Applicant: Marsupial Holdings, Inc., Waitsfield, VT (US)

(72) Inventors: William P. Parker, Waitsfield, VT (US); Julie Parker, Waitsfield, VT (US)

(73) Assignee: Marsupial Holdings, Inc., Waitsfield, VT (US)

( * ) Notice: Subject to any disclaimer, the term of this patent is extended or adjusted under 35 U.S.C. 154(b) by 0 days.

(21) Appl. No.: 16/707,484

(22) Filed: Dec. 9, 2019

(65) Prior Publication Data

US 2020/0117081 A1     Apr. 16, 2020

Related U.S. Application Data

(63) Continuation of application No. 16/442,244, filed on Jun. 14, 2019, now Pat. No. 10,503,062, which is a continuation of application No. 15/641,941, filed on Jul. 5, 2017, now Pat. No. 10,324,372, which is a continuation of application No. PCT/US2016/012242, filed on Jan. 5, 2016.

(60) Provisional application No. 62/100,062, filed on Jan. 5, 2015.

(51) Int. Cl.
| | |
|---|---|
| *G03F 1/80* | (2012.01) |
| *G03F 1/50* | (2012.01) |
| *G03F 1/68* | (2012.01) |
| *G03F 1/22* | (2012.01) |
| *G03F 7/00* | (2006.01) |
| *G03F 7/20* | (2006.01) |
| *G03F 7/36* | (2006.01) |

(52) U.S. Cl.
CPC .................. *G03F 1/80* (2013.01); *G03F 1/22* (2013.01); *G03F 1/50* (2013.01); *G03F 1/68* (2013.01); *G03F 7/0005* (2013.01); *G03F 7/2004* (2013.01); *G03F 7/36* (2013.01)

(58) Field of Classification Search
CPC ..... G03F 1/22; G03F 1/50; G03F 1/68; G03F 1/80
USPC .......................................................... 430/5
See application file for complete search history.

(56) References Cited

U.S. PATENT DOCUMENTS

| | | | |
|---|---|---|---|
| 4,686,162 A | 8/1987 | Stangl et al. | |
| 5,830,605 A | 11/1998 | Kazuhiro et al. | |
| 2005/0287445 A1 | 12/2005 | Liu | |

FOREIGN PATENT DOCUMENTS

| | | |
|---|---|---|
| JP | 05265177 A | 10/1993 |
| JP | 09-146259 A | 6/1997 |
| JP | 2007237525 A | 9/2007 |
| JP | 2009258357 A | 11/2009 |
| JP | 2012221687 A | 11/2012 |
| JP | 2014506172 A | 11/2017 |

OTHER PUBLICATIONS

Yoshikawa, et al., "Reason for Refusal".
European Patent Office, "Communication pursuant to Article 94(3) EPC", regarding EU App. No. 16702226.8.
Lewis, et al., "Low Cost PMMA based photo-masks for 3D grey sclae micro-structuring applications", NSTI-Nanotech 2006, vol. 3, www.nsti.org, 2006.

*Primary Examiner* — Christopher G Young
(74) *Attorney, Agent, or Firm* — Shawn Gordon, Esq.; Dunkiel Saunder Elliott Raubvogel & Hand, PLLC

(57) ABSTRACT

A method of fabricating a multi-tone amplitude photomask includes providing a mask substrate. The method includes providing a stepped pattern in at least one layer of material on a surface of the mask substrate. The stepped pattern includes at least two steps and at least three levels. Each level of the stepped pattern provides a different intensity of light when a light source shines light on the stepped pattern.

20 Claims, 15 Drawing Sheets

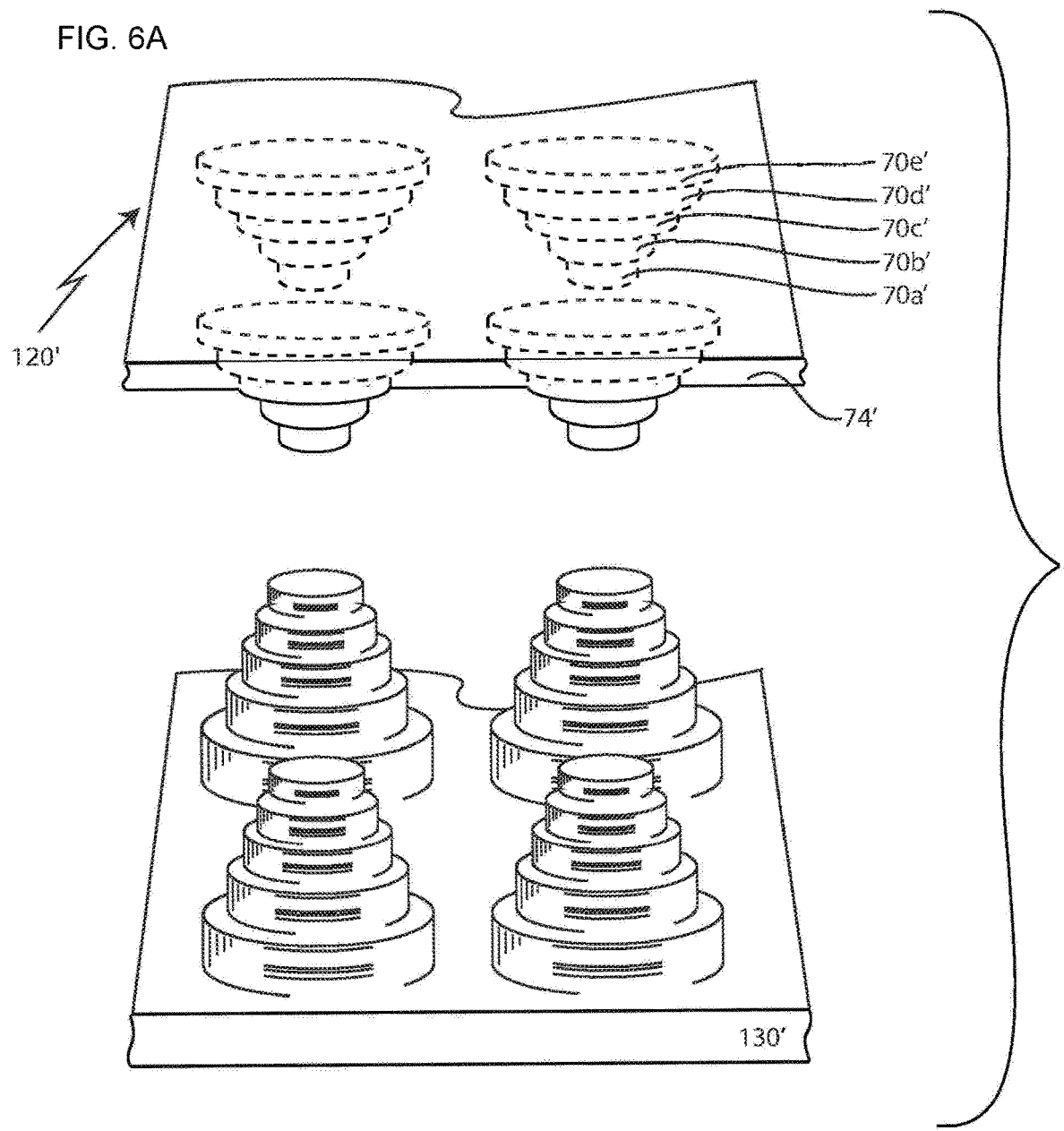

FIG. 8A
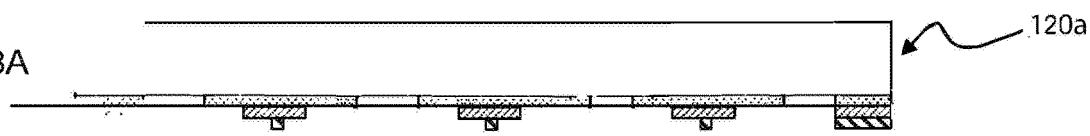
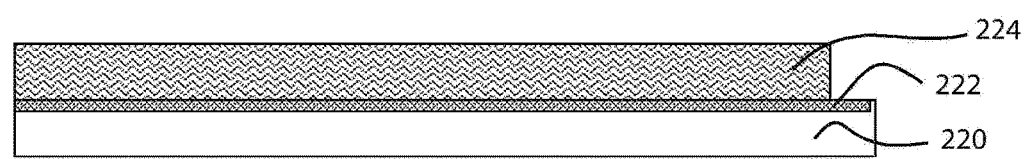
FIG. 8B
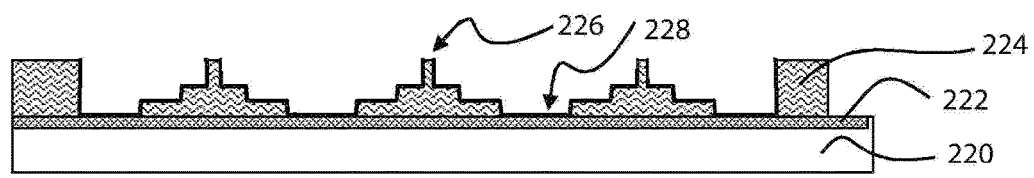
FIG. 8C
FIG. 8D
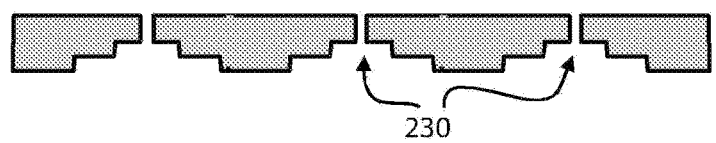

MULTI-TONE AMPLITUDE PHOTOMASK

RELATED APPLICATIONS

This application is a continuation of U.S. patent application Ser. No. 16/442,244, filed Jun. 14, 2019, and titled "Multi-Tone Amplitude Photomask,", which is a continuation of U.S. patent application Ser. No. 15/641,941, filed Jul. 5, 2017, and titled "Multi-Tone Amplitude Photomask," which is a continuation of PCT Application No. PCT/US2016/012242, filed Jan. 5, 2016, and titled "Multi-Tone Amplitude Photomask," which claims priority to U.S. Provisional Application No. 62/100,062, filed Jan. 5, 2015, and titled "Multi-Tone Amplitude Photomask," each of the foregoing being incorporated by reference in their entireties.

FIELD

This patent application generally relates to a way of providing a multi-tone photomask. More particularly, it relates to a scheme for making a photomask that has multiple levels of optical density. Even more particularly, it relates to a scheme for making a photomask that provides a pattern on a workpiece with several different heights of photoresist.

BACKGROUND

Multilayer structures have been formed on substrates with multiple masking steps. Each mask level has been aligned to a previous mask level, introducing alignment error. So each wafer may have slightly different alignments from others. Thus, products formed on different wafers will have different misalignments and will be different from each other. In addition, each masking step has required a substantial amount of time, and multiple masking steps have required a multiple of this processing time for manufacturing the products. In addition, each mask and each masking step has a substantial cost. Applicants recognized that better schemes than those available are needed, and such solutions are provided by the following description.

SUMMARY

One aspect of the present patent application is a method of fabricating a multi-tone amplitude photomask. The method includes providing a mask substrate. The method also includes providing a stepped pattern in at least one layer of material on a surface of said mask substrate. The stepped pattern includes at least two steps and at least three levels. Each level of the stepped pattern provides a different intensity of light when a light source shines light on the stepped pattern.

BRIEF DESCRIPTION OF THE DRAWINGS

The foregoing will be apparent from the following detailed description, as illustrated in the accompanying drawings, in which:

FIG. 6A is a three-dimensional view of a multi-tone amplitude photomask with 6 levels formed by the process of the present patent application in a stepped cone pattern and the 6 levels formed in photoresist on the substrate in a stepped cone pattern using this photomask;

FIGS. 7A-7G are cross sectional views showing an embodiment of a process for fabricating a multi-tone amplitude photomask of the present patent application in which top and bottom layers are the same material with an etch-stop layer there between;

FIGS. 8A-8D are cross sectional views showing the use of a multi-tone amplitude photomask of the present patent application to fabricate an array of aerosol nozzles;

DETAILED DESCRIPTION

The present applicants created methods of making and using a multi-tone amplitude photomask. The multi-tone amplitude photomask has multiple levels of optical density. Developing photoresist on a workpiece after exposure using the mask results in a patterned photoresist with a three-dimensional structure, which is a pattern with several different heights of photoresist on the workpiece.

In one embodiment, to fabricate a multi-tone amplitude photomask, a mask substrate is provided and a stepped pattern is provided in at least one layer of material on a surface of the mask substrate. The stepped pattern includes at least two steps and at least three levels. Each level of the stepped pattern provides a different level of intensity of light when measured at the mask when a light source shines light on the stepped pattern.

In one embodiment, the multiple levels of optical density on the multi-tone amplitude photomask are produced by providing multiple layers of light attenuating materials. Each of the layers is patterned individually. Each layer has an attenuation or optical density that depend on material characteristic and thickness. A photomask having two layers of light attenuating materials will produce 3 levels of attenuation of incident light for the exposure: no attenuation where both layers have been etched, the attenuation because of the optical density of the bottom layer in areas where the top layer has been etched and attenuation because of the optical density of both layers combined where neither layer has been etched.

More layers of light attenuating material can be provided and the provision of more layers of light attenuating material on the substrate will allow more levels of attenuation and more different heights in the exposed and developed photoresist on the workpiece.

Figure 1A:
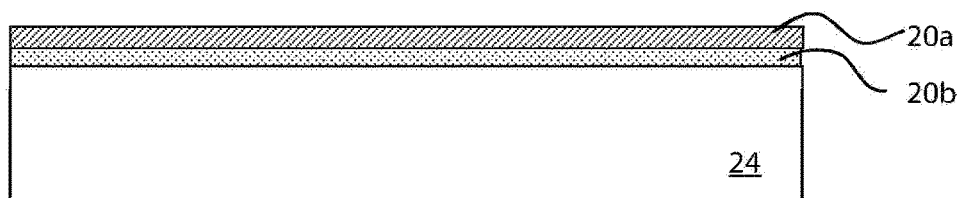
FIGS. 1A-1F are cross sectional views showing one embodiment of a process for fabricating a multi-tone amplitude photomask of the present patent application with 2 layers of material and 3 levels.

In one embodiment, a two layer structure, including at least one layer of a partially transparent material is blanket deposited on a transparent substrate to begin the fabrication of the 2-layer multi-tone amplitude photomask, as shown in FIG. 1A. In this embodiment, bottom layer 20b is a different material and has a different etch chemistry than top layer 20a so that when top layer 20a is etched, bottom layer 20b is not. In one example, top layer 20a is nickel and bottom layer 20b is chromium. Mask substrate 24 is a transparent material, such as glass, quartz, or fused silica. Although described in terms of partial transparency for a reflection mask, it is understood that the process is the same for fabricating a transmission and for fabricating a reflection mask, and in the case of a reflection mask the at least one layer is of a partially reflective material.

Figure 3A:
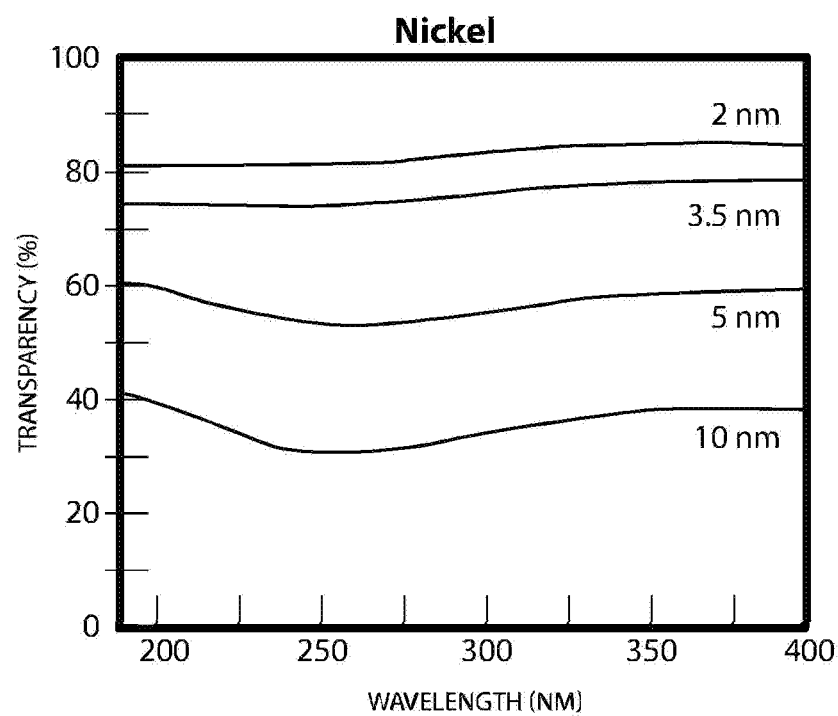
FIG. 3A is a graph showing transparency v. wavelength for various thicknesses of nickel and chromium respectively.
Figure 3A:
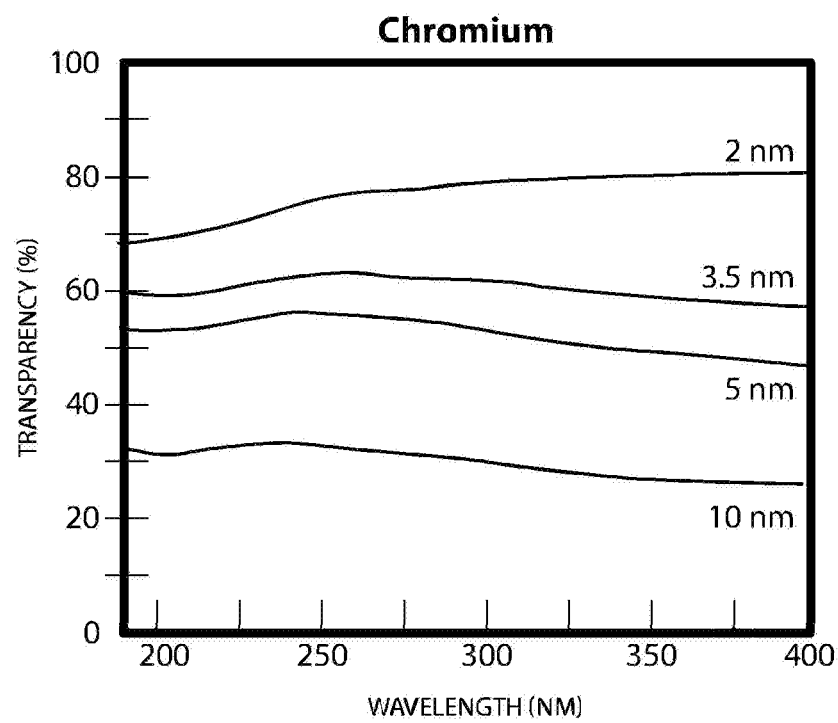

The light dose reaching photoresist on a workpiece through both layers 20a and 20b depends on the thicknesses of layers 20a and 20b. In one embodiment, bottom layer 20b is about 5 nm thick to provide about half the applied UV dose penetrating through bottom layer 20b when this bottom layer is alone on mask substrate 24. Substantially less UV light passes through in regions having both top layer 20a and bottom layer 20b depending on the thickness of top layer 20a. For example, if top layer 20a is 5 nm thick as well, as shown in the graphs in FIG. 3A, transparency for light going through both layers is reduced to about 30%. Top layer 20a can be thicker to permit less light to pass through both layers and to reduce the exposure of the photoresist in regions under both layers. For example, top layer can be in the range from 5 nm to 100 nm thick. Other thicknesses of nickel and chromium can be used to tailor vertical dimensions of the photoresist after development on a workpiece exposed using this mask. For example, top layer can be in the range from 5 nm to 300 nm.

Alternatively to thin metal layers, dielectric materials, such as silicon dioxide and silicon nitride, titanium dioxide, hafnium oxide, and tantalum pentoxide can be used with thicknesses tailored to provide partial transparency or partial reflectivity to a predetermined wavelength of light that will be used with the mask. For improved transmittivity or reflectivity multiple layers of high and low index materials are used. For example, while a thickness equal to a quarter wave in the material would provide maximum transmission through a dielectric layer and while a thickness equal to a half wave in the material would provide maximum reflection, a thickness adjusted between a quarter wave and a half wave would provide partial transmission and partial reflection. In addition to metals and dielectrics, other partially transparent materials can be used, such as dyed polymer.

Top and bottom metal or dielectric layers 20a and 20b can be deposited by techniques such as evaporation, chemical vapor deposition, sputtering, and physical vapor deposition. For a dyed material, thicker layers can be deposited and spinning, spraying, or roll-on deposition can be used.

Figure 1B:
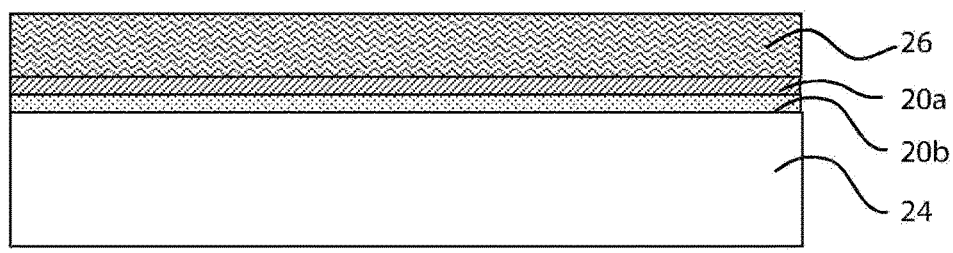
Figure 1C:
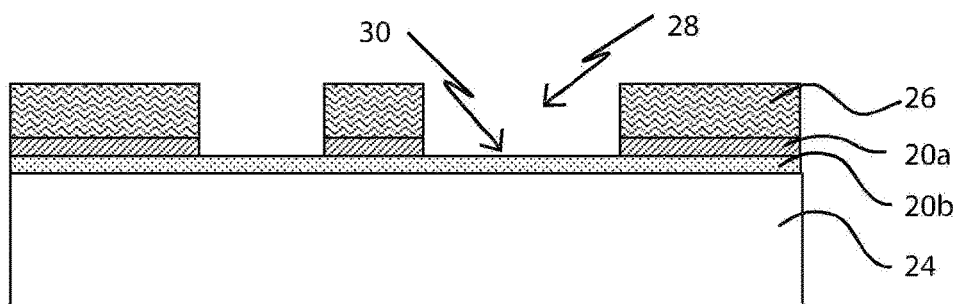
Figure 10A:
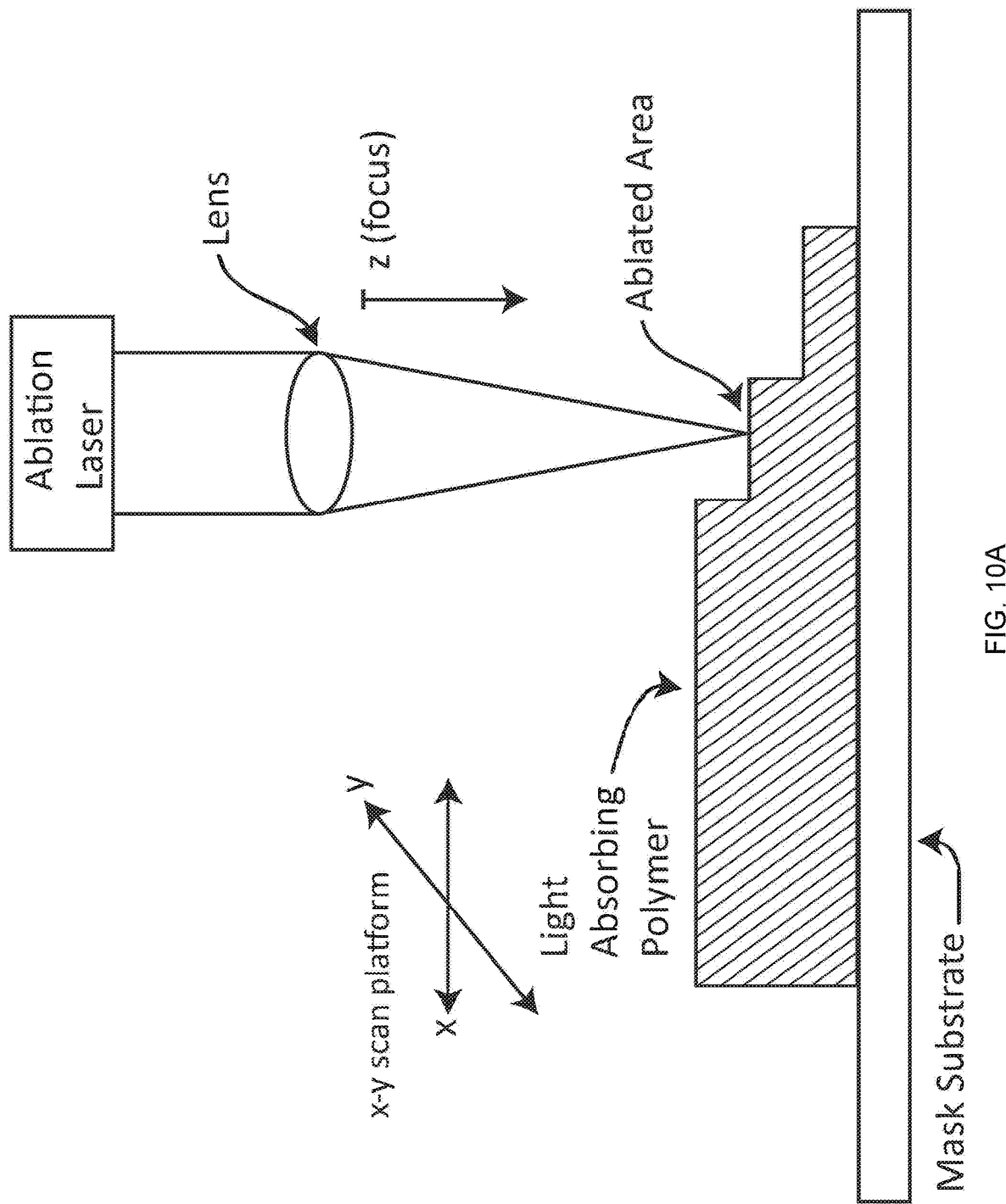
FIG. 10A is a cross sectional view showing laser ablation of a light absorbing polymer on a mask substrate to form a stepped pattern in the light absorbing polymer.
Figure 10B:
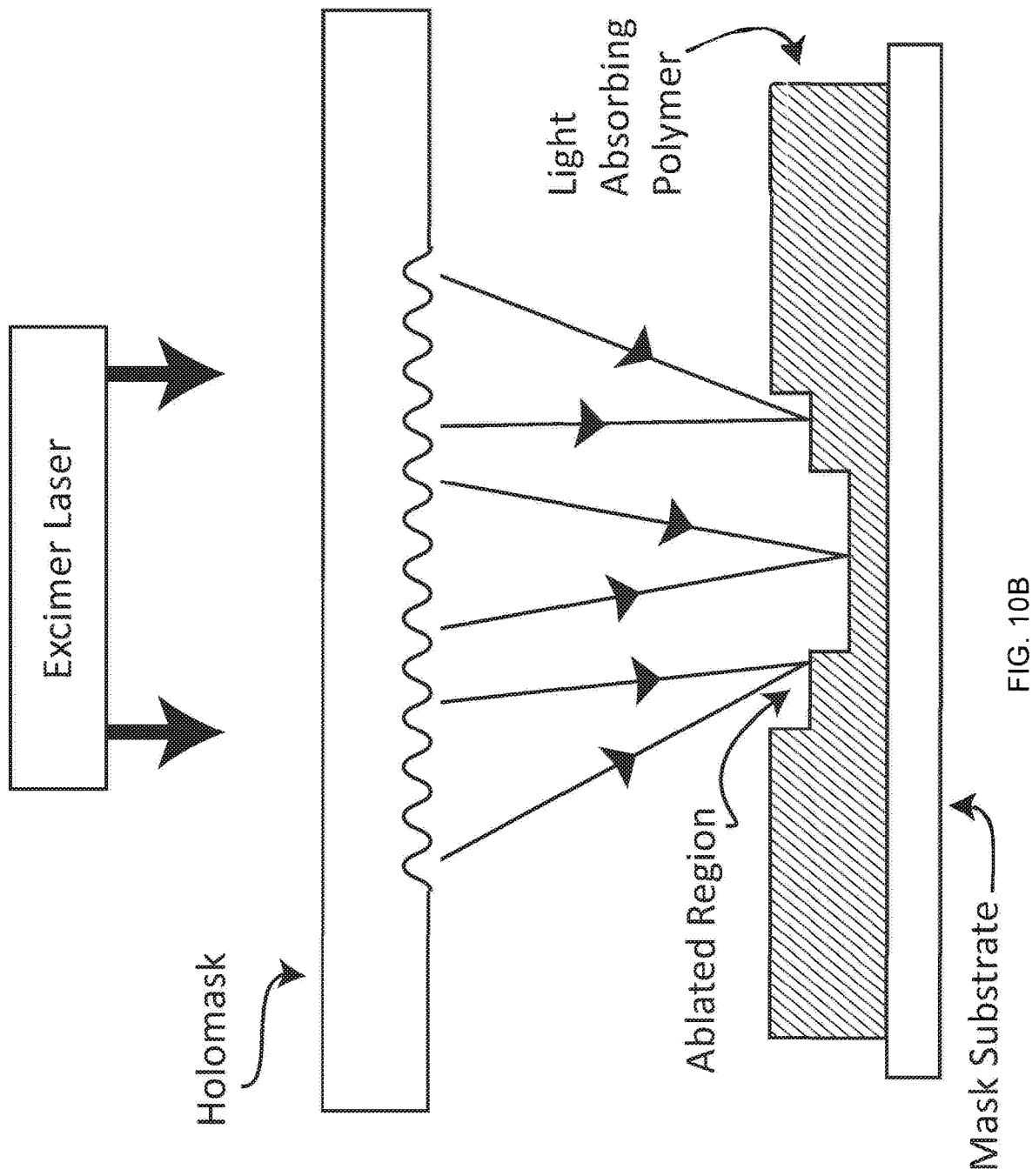
FIG. 10B is a cross sectional view showing use of a holographic mask for laser ablation of a light absorbing polymer on a mask substrate to form a stepped pattern in the light absorbing polymer.

Once top and bottom layers 20a and 20b have been deposited, first layer of resist 26 is deposited, as shown in FIG. 1B and patterned to form first openings 28 in patterned first layer of resist 26, as shown in FIG. 1C. In one embodiment, first layer of resist 26 is photoresist and the patterning to form first openings 28 is with UV light through a mask followed by developer. Other techniques, such as laser writing or electron beam writing of the pattern in the first layer of resist 26 can be used for the exposure. X-ray exposure of photoresist 26 with a mask can also be used. Alternatively, laser writing with a beam to ablate a light absorbing polymer, such as polymethyl methacrylate (PMMA) with a UV absorbing dye, or a photoresist, to a desired depth can also be used, as shown in FIG. 10A. Alternatively, a holographic mask can be used with a laser to provide ablating a stepped pattern in a light absorbing polymer on a mask substrate, as shown in FIG. 10B. In another alternative, a process such as stencil screen printing or roll-on masking material can be used to provide the patterned first layer of resist during its deposition.

Top layer of material 20a is etched away in conformance to first openings 28 in first layer of resist 26, as also shown in FIG. 1C. In one embodiment, top layer of material 20a is nickel, and is etched away with Transene Nickel Etch TFG, available from Transene Company, Inc., Danvers, Mass., in first openings 28 in first layer of resist 26 to form top layer openings 30 in top layer of material 20a. As Transene Nickel Etch TFG will not etch chromium of bottom layer of material 20b under the nickel, bottom layer of material 20b remains fully in place, as also shown in FIG. 1C.

Figure 1D:
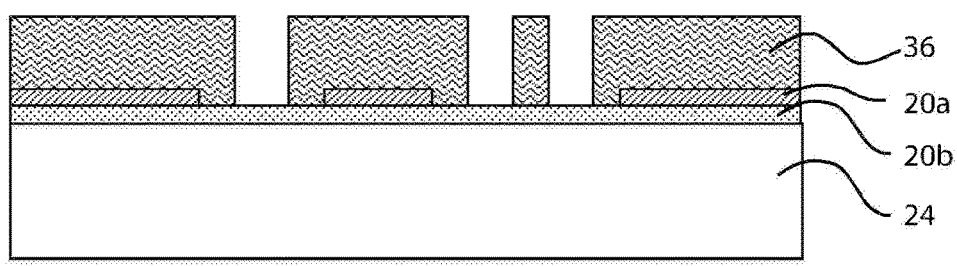

First layer of resist 26 is now stripped off and a second layer of resist is deposited and patterned to form second openings 38 in patterned second layer of resist 36, as shown in FIG. 1D. In this embodiment, second openings 38 in patterned second layer of resist 36 are within top layer openings 30 in top layer of material 20a, as also shown in FIG. 1D. In one embodiment, second layer of resist 36 is photoresist and the patterning to form second openings 38 includes aligning to alignment marks and exposing with UV light through a mask followed by developer. Other techniques, such as laser writing or electron beam writing of the pattern in the second layer of resist 36 can be used for the exposure. X-ray exposure of photoresist 36 with a mask, can also be used. Alternatively, laser writing with a beam to ablate a light absorbing polymer, such as resist, to a desired depth can be used. In another alternative, a process such as stencil screen printing, roll-on masking material, and ink-jet printing can be used to provide the patterned second layer of resist aligned with the first layer.

Figure 1E:
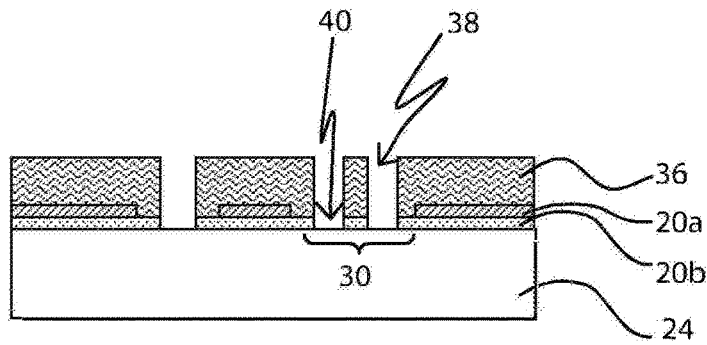

As shown in FIG. 1E, bottom layer of material 20b is now etched in conformance to second openings 38 in second layer of resist 36. In one embodiment, bottom layer of material 20b is chromium and is etched away with Transene Chromium Etch TFE in second openings 38 in second layer of resist 36 to form bottom layer openings 40 in bottom layer of material 20b. As Transene Chromium Etch TFE will not etch nickel of top layer of material 20a, and as nickel layer 20a is also protected by second layer of resist 36 in this embodiment, top layer of material 20a outside of first openings 30 remains fully in place, as shown in FIG. 1E.

Figure 1F:
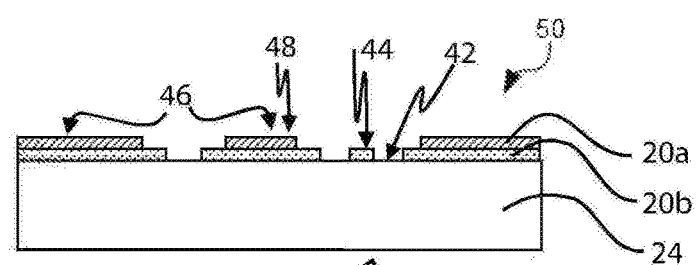

Finally, 2-layer multi-tone amplitude photomask 50 is completed when second photoresist 36 is stripped off, leaving three regions of mask substrate 24. Regions 42 of mask substrate 24 have neither bottom layer of material 20b nor top layer of material 20a; regions 44 of mask substrate 24 have bottom layer of material 20b but do not have top layer of material 20a, and regions 46 of mask substrate 24 have both bottom layer of material 20b and top layer of material 20a, as shown in FIG. 1F. In certain regions, bottom layer of material 20b and top layer of material 20a are arranged in staircase, stepped pyramid, or stepped cone shaped pattern 48 on mask substrate 24 while in other regions bottom layer 20b is by itself.

Figure 2A:
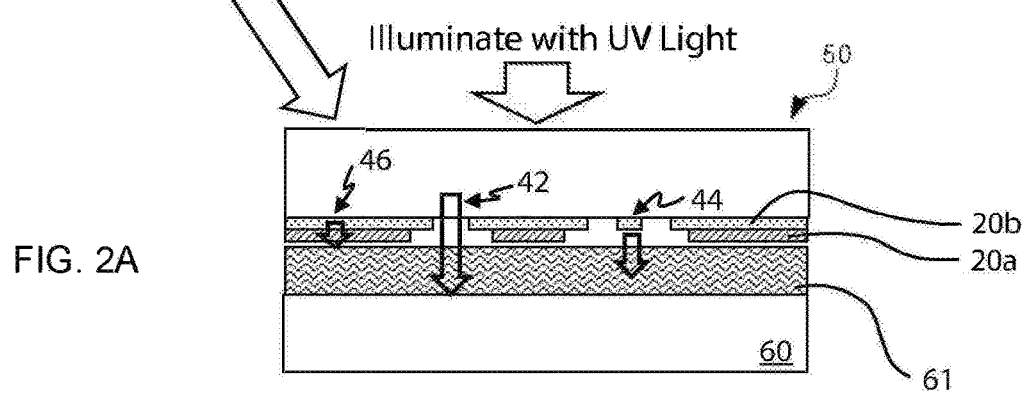
FIGS. 2A-2B are cross sectional views of a process of using the multi-tone amplitude photomask of FIG. 1F to expose and develop photoresist on a workpiece to provide a three-dimensional pattern, such as a staircase, stepped pyramid, or stepped cone pattern in the photoresist with 3 levels.
Figure 2B:
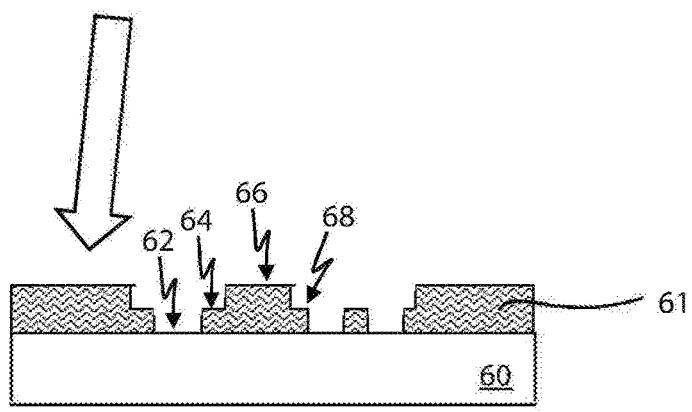

Staircase, stepped pyramid, or stepped cone shaped pattern 48 in multi-tone amplitude photomask 50 is reproduced in photoresist on workpiece 60 with a mask exposure, as shown in FIGS. 2A-2B. First, workpiece 60, such as a semiconductor wafer, is coated with workpiece photoresist 61, as shown in FIG. 2A, and exposed to UV light shining through multi-tone amplitude photomask 50. Photoresist 61 has a thickness many times greater than the thickness of staircase, stepped pyramid, or stepped cone shaped pattern 48 in multi-tone amplitude photomask 50. In one embodiment, photoresist 61 is about 1 micron thick, which is about 100 times the full thickness of metal layers on photomask 50. Photoresist 61 typically has a thickness in the range from 0.5 to 3 microns and can be in the range from 0.1 to 100 microns and even up to millimeters thick.

A technique, such as contact printing or providing multi-tone amplitude photomask 50 in a projection aligner, a stepper, or a projection scanner is used for exposing photoresist layer 61 on workpiece 60 with photomask 50.

As both transmittivity and reflectivity are dependent on metal thickness on photomask 50, photoresist layer 61 on workpiece 60 can be exposed either in transmission or reflection mode. If dielectric coatings or stacks of dielectric coatings or different metals with different inherent reflectivities are used on photomask 50 reflection mode can also be used.

In addition to UV light for exposing photoresist, other wavelengths can be used for exposing a photosensitive layer on a workpiece using photomask 50, including X-ray, visible, and infrared. Light sources, such as a mercury or xenon lamp, a laser, or an X-ray machine can be used.

If laser or electron beam writing is used to provide the patterned layers of material in the multi-tone amplitude photomask, mask generation can take many hours. However, the multi-tone amplitude photomask, once generated, can be used many times over to quickly expose photoresist on many workpieces, saving a great deal of processing time for creating a desired three-dimensional pattern in photoresist on the workpieces. Applicant found that processing time for exposing photoresist on each workpiece with the multi-tone amplitude photomask was in the range of minutes as compared to the prior art process of laser writing photoresist on each workpiece to create a three-dimensional pattern in the photoresist, which took many hours.

Regions 42 on mask substrate 24 with neither bottom layer of material 20b nor top layer of material 20a allow the UV light used in the multi-tone amplitude photomask exposure to strike photoresist 61 on workpiece 60 unimpeded. Regions 44 of mask substrate 24 with bottom layer of material 20b but not top layer of material 20a allow enough light through material 20b to sufficiently expose a top portion of photoresist 61 on workpiece 60. Regions 46 of mask substrate 24 with both bottom layer of material 20b and top layer of material 20a do not allow enough light through both layers of material 20a and 20b to expose any substantial portion of photoresist 61 on workpiece 60.

Thus, after developing, a pattern in mask 50 with three distinct heights of material in regions 42, 44, and 46 on mask substrate 24, is reproduced in photoresist 61 on workpiece 60 as photoresist regions 62, 64, and 66, such as staircase, stepped pyramid, or stepped cone shaped pattern 68 with its three heights, as shown in FIG. 2B: zero photoresist in region 62, about half the photoresist remaining in region 64, and full height photoresist in region 66.

In one experiment, AZ 4330 photoresist, Clariant Corporation AZ Electronic Materials, Somerville N.J., was spin applied to semiconductor wafer workpieces. The workpieces with 3 microns of photoresist were pre-exposure baked at 105° C. for 15 minutes. They were exposed through the multi-tone amplitude photomask using an Oriel mask aligner with a 400 Watt mercury lamp for about 30 seconds to achieve about 100 mJ/cm$^2$. The workpieces were developed in AZ 400K diluted 3:1 for 60 seconds. Resulting photoresist topology was measured on a KLA/Tencor P-2 stylus profilometer.

Figure 3B:
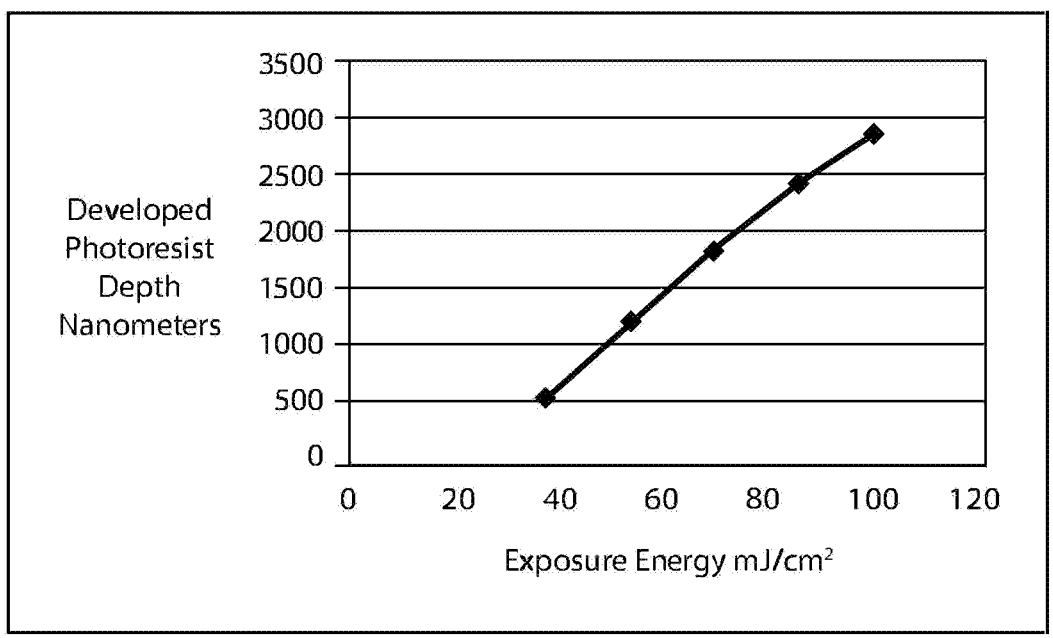
FIG. 3B is a graph showing developed photoresist depth v. exposure energy.

A graph showing developed photoresist depth as a function of exposure energy with the AZ 4330 photoresist under these bake, exposure, and develop conditions is provided in FIG. 3B. The graph shows that the top 0.5 micron of resist is developed out when the dose is about 38 mJ/cm$^2$, 1.0 microns when the energy dose is about 50 mJ/cm$^2$, 1.5 micron when the energy dose is about 60 mJ/cm$^2$, 2.0 microns when the energy dose is about 72 mJ/cm$^2$, 2.5 microns when the energy dose is about 84 mJ/cm$^2$, and 3.0 microns when the energy dose is about 100 mJ/cm$^2$.

Figure 4A:
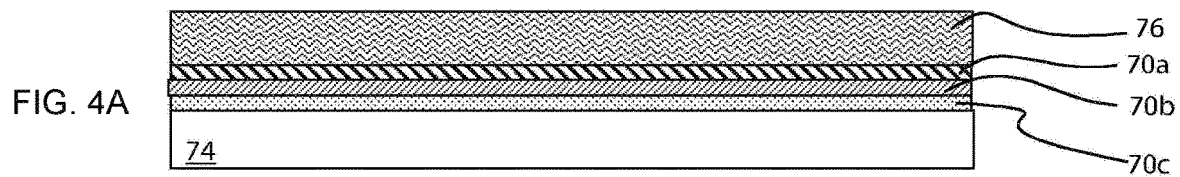
FIGS. 4A-4E are cross sectional views showing an embodiment of a process for fabricating a multi-tone amplitude photomask of the present patent application with 3 layers of material and 4 levels.
Figure 4B:
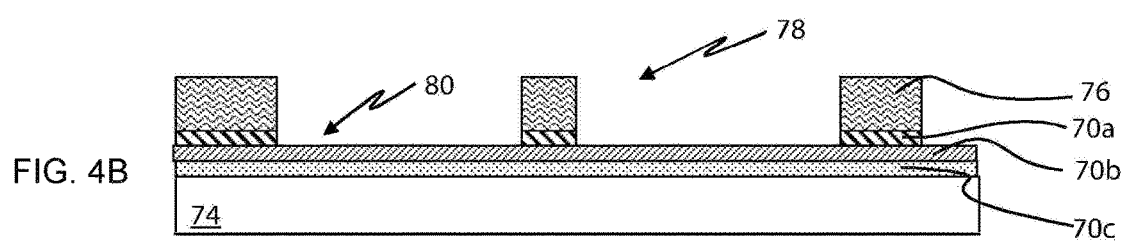
Figure 4C:
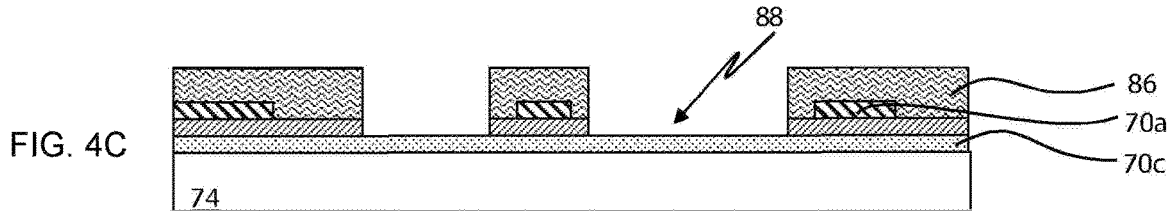
Figure 4D:
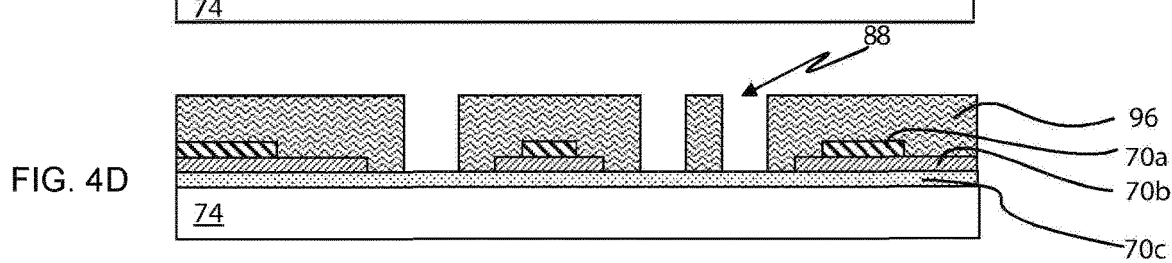
Figure 4E:
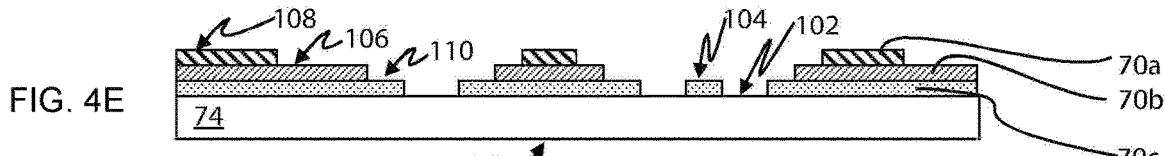
Figure 5A:
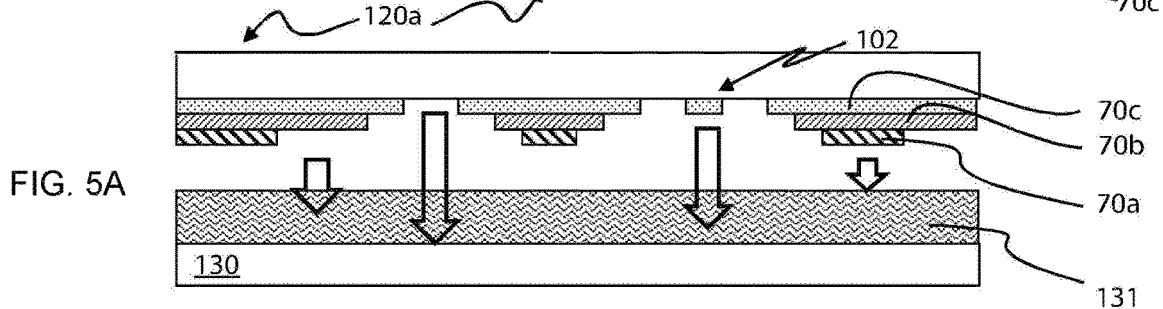
FIGS. 5A-5B are cross sectional views of a process of using the multi-tone amplitude photomask of FIG. 4E to expose and develop photoresist on a workpiece to provide a three-dimensional pattern, such as a staircase, stepped pyramid, or stepped cone pattern in the photoresist with 4 levels.
Figure 5B:
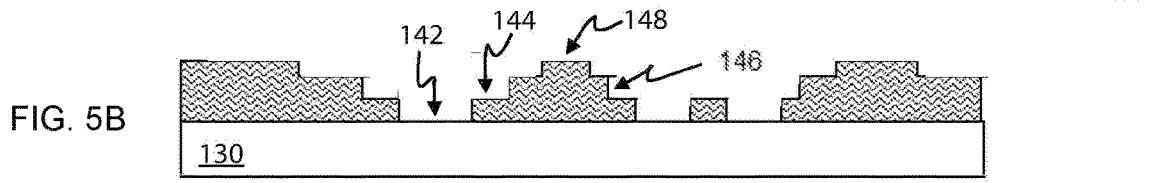

In another embodiment, 3 layers of material are formed on a transparent substrate, as shown in FIGS. 4A-4E, and the resulting four exposure levels are similarly transferred to photoresist on a workpiece with a mask exposure, as shown in FIGS. 5A-5B, to make a 4-level three-dimensional structure in the photoresist. In this embodiment the 3-layer structure includes at least two layers of partially transparent material or at least two layers of partially reflective material. The 3 layers of partially transparent or reflective material are deposited as blanket layers on a transparent mask substrate to begin the fabrication of the multi-tone amplitude photomask, as shown in FIG. 4A. In one example, top layer 70a is copper, middle layer 70b is nickel, bottom layer 70c is chromium, and mask substrate 74 is glass, quartz, or fused silica. Bottom layer 70c is 2 or 3 nm thick to provide partial transparency to UV light when this bottom layer is alone on mask substrate 74. Middle layer is also 2 or 3 nm thick to still provide partial transparency to UV light when both middle layer 70b and bottom layer 70c are on mask substrate 74.

In the reflection mode, this same construction of metal layers would operate in a reverse manner with the substrate reflecting the least light onto the workpiece and the multiple layers above it reflecting the most. It is also possible for the stack of coatings to be absorbing and to be placed on a reflective substrate such as aluminum or an aluminum coated fused silica substrate such that the greatest reflection would come from the substrate layer, with each successive layer above it absorbing more light and thus reflecting less light.

Top layer is sufficiently thick so very little UV light passes through in regions having all three layers or so insufficient light passes through all three layers to reach the threshold exposure needed by the photoresist used on the workpiece for any photoresist to be developed out. For example, top layer 70a is 10 or 20 nm thick. Top layer 70a can be thicker. Other thicknesses of copper, nickel, and chromium can be used to tailor vertical dimensions of the photoresist on a workpiece exposed using this mask to provide a desired three-dimensional structure in the photoresist.

As described herein above, other partially absorbing materials can be used, such as dielectric layers or dye containing polymer layers. Top, middle, and bottom partially transmitting layers 70a, 70b, and 70c are each deposited on mask substrate 74 by a technique, such as evaporation, chemical vapor deposition, sputtering, and physical vapor deposition.

Once top, middle, and bottom layers 70a, 70b, and 70c have been deposited on mask substrate 74, first layer of resist 76 is deposited and patterned to form first openings 78 in patterned first layer of resist 76, as shown in FIG. 4B. In one embodiment, first layer of resist 76 is photoresist and the patterning to form first openings 78 in first layer of resist 76 is with UV light through a mask followed by developer. Other exposure techniques, such as laser or electron beam writing exposure or X-ray exposure of the resist can be used. Alternatively, a process such as stencil screen printing or roll-on masking material is used to provide the patterned first layer of resist during its deposition.

Top layer of material 70a is etched away in conformance to first openings 78 in first layer of resist 76, as also shown in FIG. 4B. In the embodiment in which top layer of material 70a is copper, it may be etched away with Transene Copper etch APS-100. Thus, top layer openings 80 in top layer of material 70a are formed while the copper etchant does not affect nickel of middle layer of material 70b under the copper, so middle layer of material 70b and bottom layer 70c remain fully in place, as also shown in FIG. 4B.

First layer of resist 76 is now stripped off and second layer of resist 86 is deposited and patterned to form second openings 88 in patterned second layer of resist 86, as shown in FIG. 4C. The patterning to form second openings 88 in second layer of resist 86 is with UV light through a mask, using laser or electron beam writing exposure or X-ray exposure of second layer of resist 86. Alternatively, a process such as stencil screen printing or roll-on masking material is used to provide the patterned second layer of resist during its deposition. In this embodiment, second openings 88 in patterned second layer of resist 86 are within top layer openings 80 in top layer of material 70a, as also shown in FIG. 4C.

Middle layer of material 70b is etched in conformance to second openings 88 in second layer of resist 86, as also shown in FIG. 4C. In the embodiment in which middle layer of material 70b is nickel and is etched away with Transene Nickel Etch TFG in second openings 88 in second layer of resist 86 to form middle layer openings in middle layer of material 70b. As the Transene nickel etchant will not etch chromium of bottom layer of material 70c, and as copper layer 70a is protected by second layer of resist 86, top layer of material 70a outside of first openings 80 remains fully in place and bottom layer of material 70c remains fully in place, as shown in FIG. 4C.

Second layer of resist 86 is now stripped off and a third layer of resist 96 is deposited and patterned to form third openings 98 in patterned third layer of resist 96, as shown in FIG. 4D. The patterning to form third openings 98 in third layer of resist 96 is with UV light through a mask, using laser or electron beam writing exposure or X-ray exposure of second layer of resist 96. Alternatively, a process such as stencil screen printing or roll-on masking material is used to provide the patterned second layer of resist during its deposition. In this embodiment, third openings 98 in patterned third layer of resist 96 are within middle layer openings 88 in middle layer of material 70b, as also shown in FIG. 4D.

Bottom layer of material 70c is etched in conformance to third openings 98 in third layer of resist 96, as also shown in FIGS. 4D and 4E. In the embodiment in which bottom layer of material 70c is chromium, it is etched away with Transene Chromium Etch TFE in third openings 98 in third layer of resist 96 to form bottom layer openings 102 in bottom layer of material 70c extending to mask substrate 74.

Finally, multi-tone amplitude photomask 120a is completed when third photoresist 96 is stripped off, leaving four regions on mask substrate 74, as also shown in FIG. 4E. Openings 102 on mask substrate 74 have neither bottom, middle, or top layer of material 70a, 70b, and 70c; regions 104 on mask substrate 74 have only bottom layer of material 70c; regions 106 on mask substrate 74 have only bottom layer of material 70c and middle layer of material 70b; regions 108 on mask substrate 74 have all three: bottom, middle, and top layers 70a, 70b, 70c, as shown in FIG. 4E. In certain regions, the three layers of material 70b are arranged in stepped pattern 110 on mask substrate 74. When viewed in three dimensions, stepped pattern 110 can be a staircase, a stepped pyramid, or a stepped cone.

Stepped pattern 110 provided in 3-layer multi-tone amplitude photomask 120a is reproduced in photoresist on workpiece 130, as shown in FIGS. 5A-5B. First, workpiece 130, such as a semiconductor wafer, is coated with workpiece photoresist 131, as shown in FIG. 5A, and exposed to UV light shining through 3-layer multi-tone amplitude photomask 120a. A technique, such as contact printing or providing 3-layer multi-tone amplitude photomask 120a in a projection aligner or scanner is used for the exposure.

Openings 102 on mask substrate 74 with neither bottom, middle, or top layer of material 70c, 70b, and 70a allow the exposure light, such as UV light, to strike photoresist 131 on workpiece 130 unimpeded. Regions 104 of mask substrate 74 with bottom layer of material 70c but not middle or top layer of material 70b and 70a allow enough light through bottom layer material 70c to sufficiently expose a top portion of photoresist 131 on workpiece 130. Regions 106 of mask substrate 74 with both bottom and middle layers of material 70c and 70b allow less light through but still allow enough for an exposure closer to the top surface of resist 131. Regions 108 of mask substrate 74 with all three, bottom, middle and top layers of material 70c, 70b, and 70a have enough material blocking light to prevent any part of photoresist 131 on workpiece 130 from being sufficiently exposed so developer does not remove material. Thus, upon developing, a pattern with four distinct heights 142, 144, 146, and 148 is formed in photoresist 131 on workpiece 130, as shown in FIG. 5B to create a three-dimensional structure: zero photoresist in region 142, about one third height photoresist in region 144, about two thirds height photoresist in region 146 and full height photoresist in region 148.

More thin metal layers can be formed on transparent mask substrate 74, as shown with 5-layer multi-tone amplitude photomask 120a in the three-dimensional view in FIG. 6A. In one embodiment, as the number of layers 70a', 70b', 70c', 70d', and 70e' increases, the thickness of each layer is decreased so some light can get through the bottom four of them. In one embodiment, the full thickness of all layers combined 70a' and 70b' and 70c' and 70d' and 70e' is sufficient to effectively block exposure of resist on a workpiece while regions with step-wise fewer layers, such as the annular region having layers 70d' and 70e', allow correspondingly greater doses of light. With the 3-layer multi-tone amplitude photomask 120a in FIG. 5B, this causes a deeper exposure in photoresist 131 on mask substrate 74 sufficient for developing a deeper three-dimensional pattern. Similarly, for 5-layer multi-tone amplitude photomask 120', as shown in FIG. 6A, a five-level pattern is produced. Thus, the position and number of layers in multi-tone amplitude photomask 120, 120' is reproduced in the photoresist after exposure and development.

In FIG. 6A, openings in photoresist are round, and the largest round opening in resist is for etching top metal layer 70a'. For each subsequent layer of metal down 70b', 70c', 70d', 70e' the opening in the corresponding layer of resist is smaller, to leave metal layers in place with increasingly larger diameter. This scheme in one dimension is also shown in the cross sections of FIGS. 4B-4E for the 3-layer multi-tone amplitude photomask fabrication process.

Figure 6B:
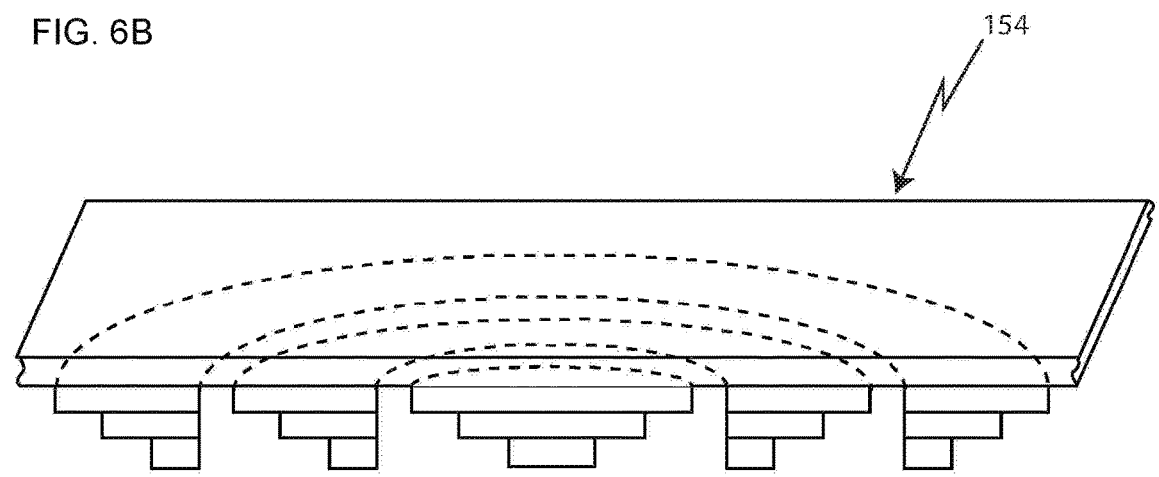
FIG. 6B is a three-dimensional view of a multi-tone amplitude photomask with 4 levels formed by the process of the present patent application in a diffractive lens pattern and the 4 levels formed in photoresist on the substrate in a diffractive lens pattern using this photomask.
Figure 6B:
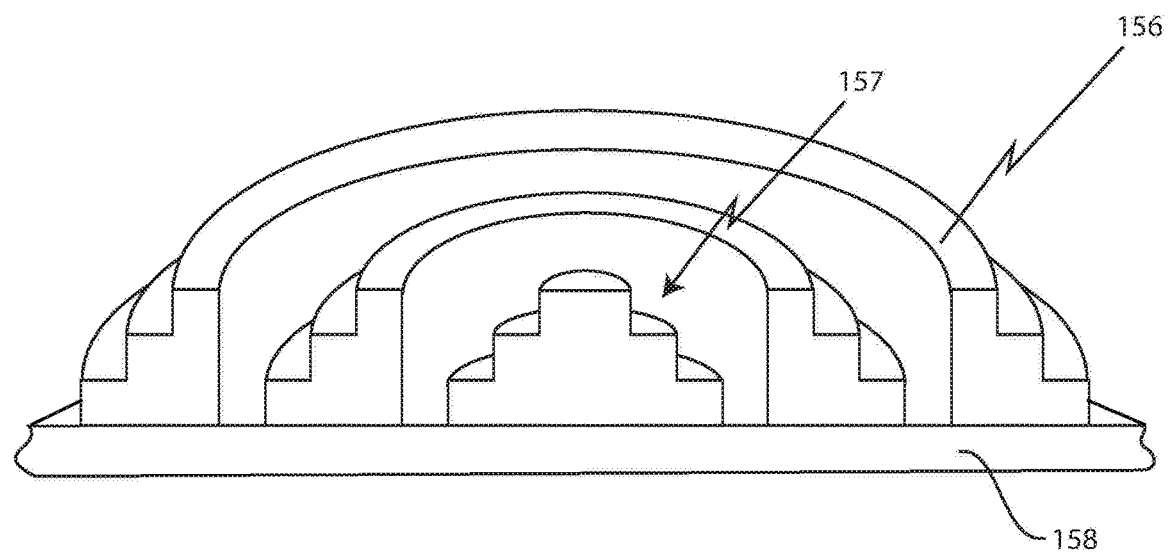
Figure 6C:
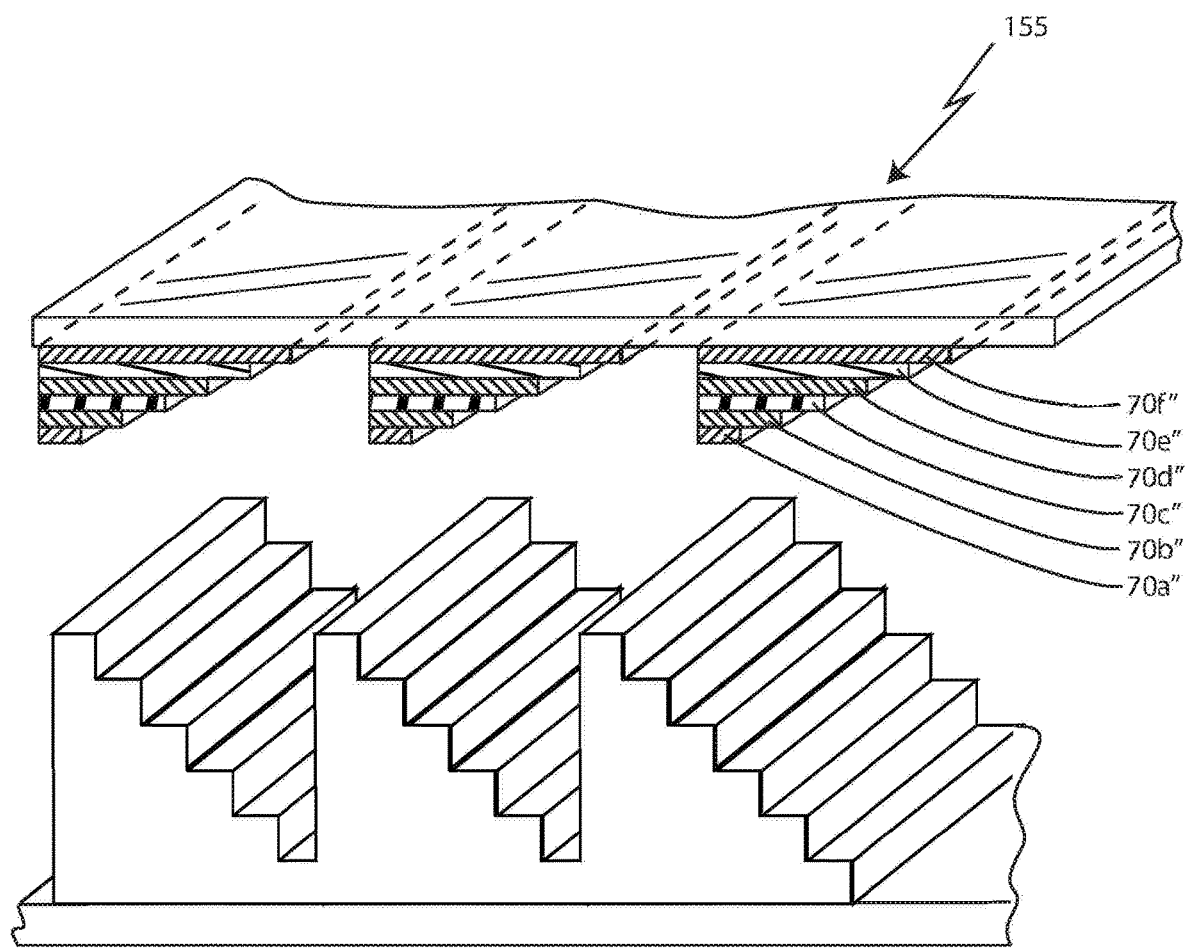
FIG. 6C is a three-dimensional view of a multi-tone amplitude photomask with 7 levels formed by the process of the present patent application in a diffraction grating pattern and the 7 levels formed in photoresist on the substrate in a diffraction grating pattern using this photomask.

Other embodiments can have different patterns for the metal layers, such as those multi-layer multi-tone amplitude photomask shown for diffractive lens 154 in FIG. 6B and for diffraction grating 155 in FIG. 6C.

In one embodiment, and as shown in FIG. 6B, photoresist 156 for fabricating a diffractive lens is 3 microns tall and each step 157 in photoresist 156 is 1 micron high for focusing light in the infrared range. In another embodiment, an array of 400 of these diffractive lenses was formed, the whole array 20 mm in diameter. Each photoresist lenslet in the array was 500 microns across and 1.7 um tall for focusing light in the near infrared wavelength, 0.85 microns. To fabricate the diffractive lens a directional reactive ion etch was used on photoresist 156 on fused silica workpiece 158 to replicate the photoresist pattern in the fused silica below. In one embodiment, the etch chemistry is adjusted to provide the etch rate approximately the same for photoresist and fused silica. Parameters for such control include oxygen and fluorine precursor gas flow rates and pressures.

To fabricate multi-layer multi-tone amplitude photomask 155 for the diffraction grating with the staircase shape of FIG. 6C, a rectangular opening in each successive resist layer is used in its fabrication. The largest rectangular opening in the first resist applied leaves resist coating only top metal layer 70a" across its width, allowing etching top layer 70a" over all other anticipated steps. Once top layer 70a" is etched except under the first resist, that resist is stripped and a second layer of resist is deposited for coating both top metal layer 70a" and second metal layer 70b" and for allowing etching second metal layer 70b" over all other anticipated steps. The process continues with layers of resist with increasing coating area and decreasing opening size and successively etching metal layers 70c", 70d", 70e", and 70f to create staircase mask 155. As described herein above, different metals with different etch characteristics and different etchants are used for the different layers. Alternatively, different dielectrics or dyed polymers and different etchants are used for the different layers.

As with the diffractive lens, the diffraction grating pattern formed in photoresist is replicated in the fused silica workpiece using reactive ion etch. The diffraction grating so formed spreads light striking at an angle into component colors. One application is for use in a spectrometer. In one embodiment, the height of each staircase pattern is in the range from hundreds of nm to tens of microns, the height being related to wavelength of light to be used. Applicant found that the fabrication process described herein above enables control over the width of each stair, the angle of the staircase, the number of stairs in the staircase, and ratio of width to depth in the staircase.

Figure 7A:
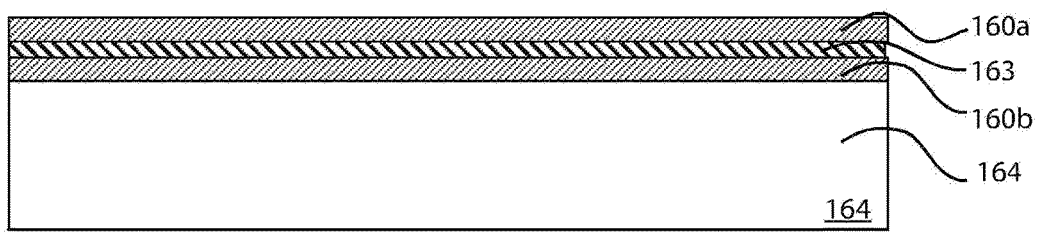

Another embodiment includes an etch stop layer in the multi-tone amplitude photomask, allowing the top and bottom layers to be the same material, as shown in FIGS. 7A-7G. In this embodiment, top and bottom layers of material 160a, 160b are blanket deposited, sandwiching etch stop layer 163 on transparent substrate 164 to begin the fabrication of the multi-tone amplitude photomask, as shown in FIG. 7A. In one example, top and bottom layers 160a, 160b are both chromium, etch stop layer 163 is silicon dioxide, and substrate 164 is glass, quartz, or fused silica. Bottom layer 160b is about 5 nm thick to provide partial transparency to UV light when this bottom layer is alone on substrate 164. Very little UV light passes through in regions having both top layer 160a and bottom layer 160b if top layer 160a is at least 10 nm thick. Top layer 160a can be thicker. Other thicknesses of chromium can be used to tailor vertical dimensions of the photoresist on a workpiece exposed using this mask. Other partially absorbing materials can be used, such as nickel or copper. Top and bottom layers 160a and 160b can be deposited by techniques, such as evaporation, chemical vapor deposition, sputtering, and physical vapor deposition, etch stop layer 163 can be deposited using chemical vapor deposition.

While a 2-layer structure is shown in FIGS. 7A-7D, a structure with more layers can also be fabricated using this process repetitively with an etch stop layer between each metal layer. Applicants found that a layer of silicon dioxide 4 nm thick is sufficient to provide etch stopping.

Figure 7B:
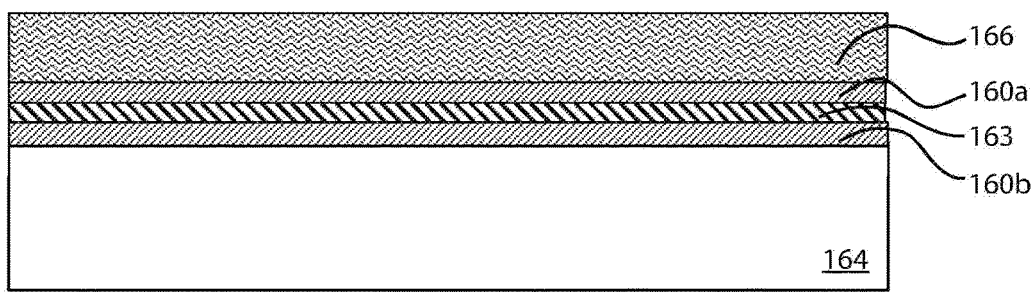
Figure 7C:
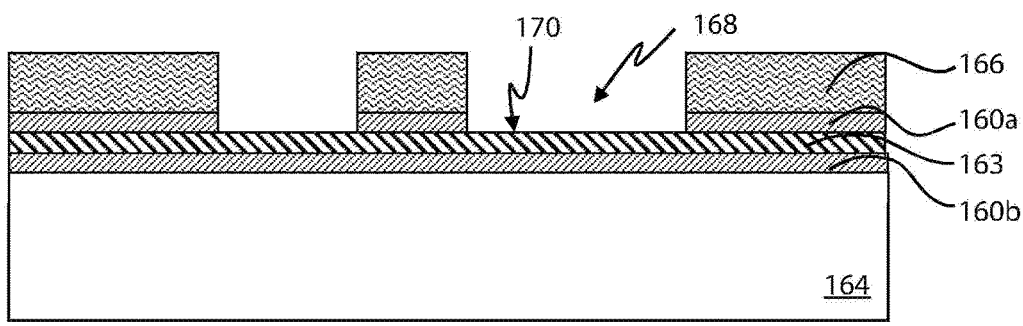

Once top and bottom layers 160a and 160b and etch stop layer 163 have been deposited, first layer of resist 166 is deposited, as shown in FIG. 7B and patterned to form first openings 168 in patterned first layer of resist 166, as shown in FIG. 7C. In one embodiment, first layer of resist 166 is photoresist. The patterning to form first openings 168 in first layer of resist 166 is with UV light through a mask, using laser or electron beam writing exposure or X-ray exposure, followed by developer. Alternatively, a process such as stencil screen printing or roll-on masking material is used to provide patterned first layer of resist 166 during its deposition.

Top layer of material 160a is etched away in conformance to first openings 168 in first layer of resist 166, as also shown in FIG. 7C. In one embodiment, top layer of material 160a is chromium, and is etched away with Transene Chromium Etch TFE in first openings 168 in first layer of resist 166 to form top layer openings 170 in top layer of material 160a. As Transene Chromium Etch TFE will not etch silicon dioxide of etch stop layer 163, both etch stop layer 163 and bottom layer of material 160b remain fully in place, as also shown in FIG. 7C.

Figure 7D:
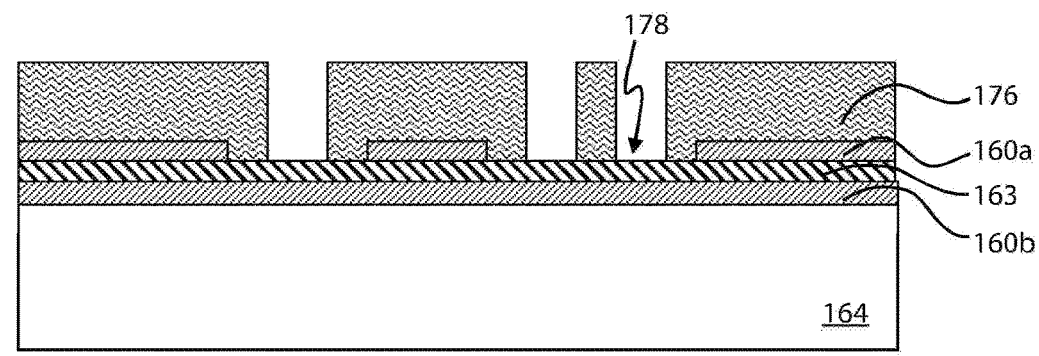

First layer of resist 166 is now stripped off and a second layer of resist is deposited and patterned to form second openings 178 in patterned second layer of resist 176, as shown in FIG. 7D. Second openings 178 in patterned second layer of resist 176 are within top layer openings 170 in top layer of material 160a, as shown in FIGS. 7C and 7D. In one embodiment second layer of resist 176 is photoresist. The patterning to form second openings 178 in second layer of resist 176 is with UV light through a mask, using laser or electron beam writing exposure or X-ray exposure, followed by developer. Alternatively, a process such as stencil screen printing or roll-on masking material is used to provide patterned second layer of resist 176 during its deposition.

Etch stop 163 is now etched in conformance to second openings 178 in second layer of resist 176, as shown in FIG.

Figure 7E:
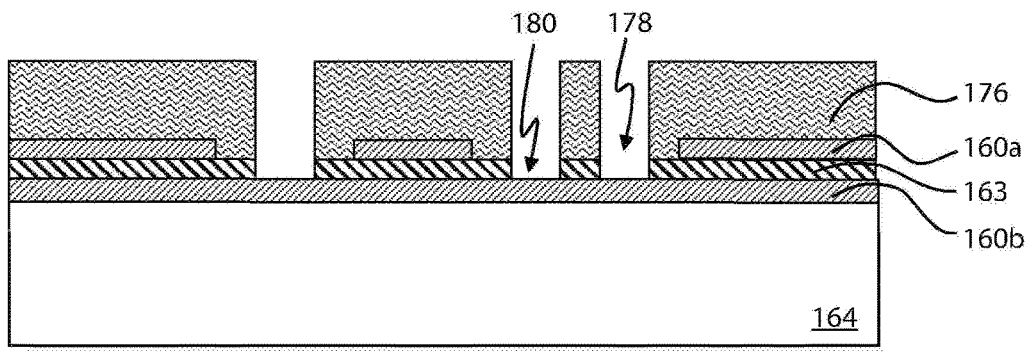

7E. In one embodiment, etch stop layer 163 is silicon dioxide and is etched away with hydrofluoric acid in second openings 178 in second layer of resist 176 to form openings 180 in etch stop layer 163. As hydrofluoric acid will not etch chromium of bottom layer of material 160b, and as chromium layer 160a is also protected by second layer of resist 176, neither layer of chromium is affected by the oxide etch, as shown in FIG. 7E.

Figure 7F:
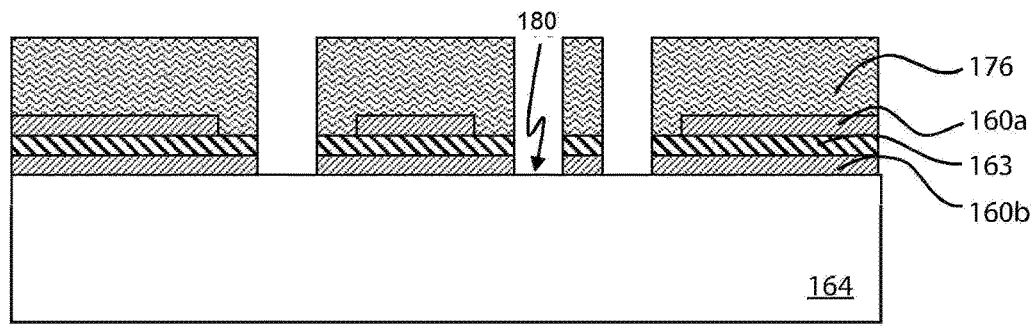

Bottom layer 160b is now etched in conformance to second openings 178 in second layer of resist 176, as shown in FIG. 7F. In one embodiment, bottom layer 160b is chromium and is etched away with Transene Chromium Etch TFE in second openings 178 in second layer of resist 176 to form openings 180 in etch stop layer 163. As Transene Chromium Etch TFE will not etch the glass of substrate 164 and as chromium layer 160a is also protected by second layer of resist 176, nothing else is affected by the Transene Chromium Etch TFE, as shown in FIG. 7F.

Figure 7G:
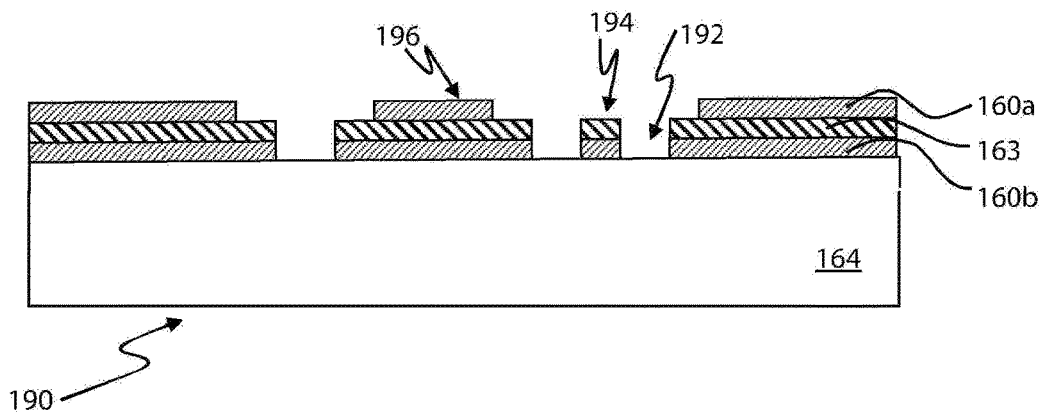

Finally, multi-tone amplitude photomask 190 is completed and ready for use when second photoresist 176 is stripped off, leaving three regions of substrate 164. Regions 192 of substrate 164 have neither layer of material 160a and 160b nor etch stop layer 163; regions 194 of substrate 164 have bottom layer of material 160b and etch stop layer 163 but do not have top layer of material 160a, and regions 196 of substrate 164 have both layers of material 160a and 160b and etch stop layer 163, as shown in FIG. 7G. In certain regions, bottom layer of material 160b with etch stop layer 163 and top layer of material 160a are arranged in staircase pattern on substrate 164.

Multi-tone amplitude photomask 50, 120, 120', 190 are used to fabricate devices that have layered or curved shapes. In one embodiment, 3-layer multi-tone amplitude photomask 120 is used in the fabrication of an array of aerosol nozzles, as shown in FIGS. 8A-8D. In another embodiment, 3-layer multi-tone amplitude photomask 120a is used in the fabrication of an array of micro lenses, as shown in FIGS. 9A-9D.

For fabricating the array of aerosol nozzles, workpiece 220, coated with electroplating seed layer 222, and provided with blanket photoresist layer 224, is exposed to ultraviolet light through 3-layer multi-tone amplitude photomask 120, as shown in FIG. 8A. After developing photoresist 224 has 4-step staircase structures 226, with cavities 228 there between, as shown in FIG. 8B. In one embodiment the lowest step in 4-step photoresist staircase structure 226 is 0.5 microns thick, the second step is 0.5 microns thick, and the highest step is 4 microns thick. The highest step has a diameter that will become the orifice of the nozzle. In one embodiment, electroplating seed layer 222 is sputtered nickel with a thickness in the range from about 5 nm to about 500 nm on sputtered chromium with a thickness in the range from 1 to 2 nm. The seed layer is allowed to oxidize to form a passivation that allows later release of electroplated material from seed layer 222. Seed layers can also be provided on workpiece 220 using evaporation, ion beam deposition, physical vapor deposition, and laser deposition.

Workpiece 220 is now electrically connected for electroplating through plating seed layer 222 as masked by 4-step staircase photoresist structures 226, as shown in FIG. 8C, and electroplated palladium nickel alloy fills cavities 228 between 4-step staircase photoresist structures 226. Other noble metals and alloys including noble metals can be used.

Photoresist 224 and 226 are now removed, such as in an acetone bath, leaving array of electroplated palladium nickel alloy micro nozzles 230 which are released from substrate 220 mechanically, by peeling, as shown in FIG. 8D. The process allows each nozzle of the array of nozzles to have an orifice defined by the highest step in photoresist structure 226 having a diameter in the range from 2.5 to 4.5 microns.

Figure 9A:
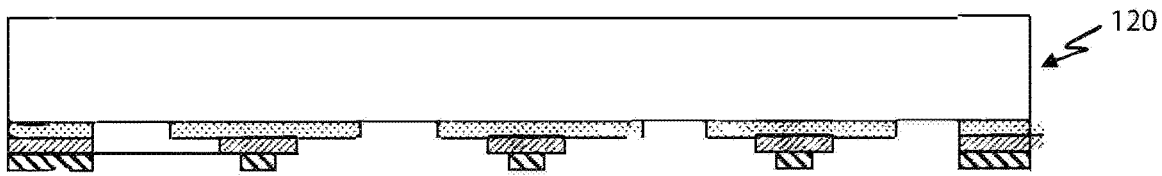
FIGS. 9A-9D are cross sectional views showing the use of a multi-tone amplitude photomask of the present patent application to fabricate an array of micro lenses.
Figure 9B:
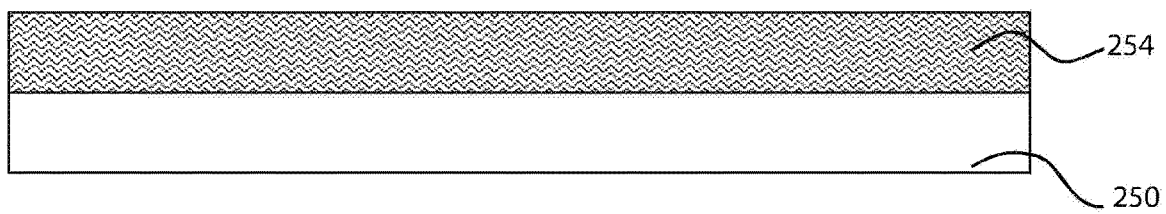

For fabricating the array of micro lenses, workpiece 250 is provided with blanket photoresist layer 254, and is exposed to ultraviolet light through 3-layer multi-tone amplitude photomask 120, as shown in FIG. 9A. For the lenses, workpiece 250 is fabricated of a material, such as fused silica. After developing, photoresist 254 has the 3-step cone structures 254', as shown in FIG. 9B.

Figure 9C:
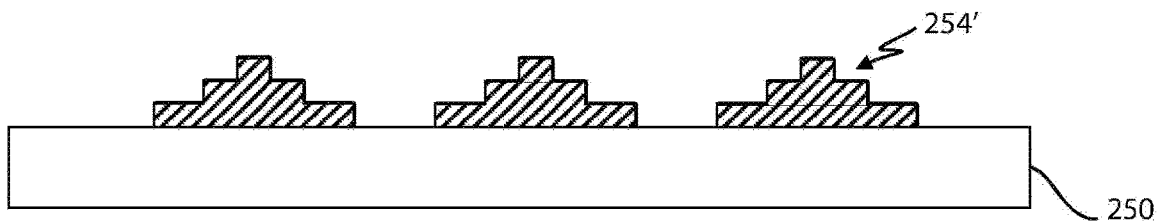

Workpiece 250 with its photoresist 3-step cone structures 254' is now subjected to baking at 150 degrees C. to melt photoresist 3-step cone structures 254', as shown in FIG. 9C, creating lens-shaped regions of photoresist 254" on fused silica workpiece 250.

Figure 9D:
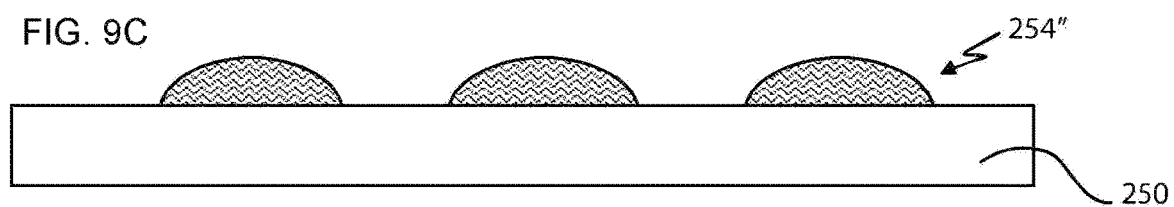

Workpiece 250 with its lens-shaped regions of photoresist 254" is now subjected to reactive ion etching which transfers lens shaped regions of photoresist 254" into fused silica workpiece 250, as shown in FIG. 9D, creating array of micro lenses 256 on fused silica workpiece 250. Conditions for the reactive ion etch are 300 Watts, CF4 at 45 standard cubic centimeters per minute, $O_2$ at 5 standard cubic centimeters per minute, 200 mTorr for 40 minutes using a Phantom II reactive ion etch tool, from Trion Technology, Clearwater, Fla.

In another embodiment, a 3-D printer is used to deposit each layer of dyed polymer for the photomask, as shown in FIG. 6A. In this case, layers 70a'-70e' are each in the range from 1 micron to tens of microns thick. In one embodiment, all layers have the same thickness and the same transmittivity so regions with multiple layers have correspondingly reduced transmittivity depending on the number of layers through which an exposure beam travels. In another embodiment, different layers result in different reflectivities from a highly reflective mask substrate depending on the thickness of the dyed polymer absorbing light in both passes as it travels to and from the highly reflective mask substrate.

The 3-D printer can be a standard ink-jet printer in which successive layers of ink are deposited one after another. In one example, the dye or pigment concentration in the ink or polymer binder is selected so each layer of ink deposited has a transmittivity such as 80%. In another example, each layer has a transmittivity of 65% so light penetrating five layers would have its intensity diminished to 5% of the incident intensity. In another example, the different print heads of the ink-jet printer are used to print inks with different transmittivities so each layer can have its own transmittivity.

Figure 11:
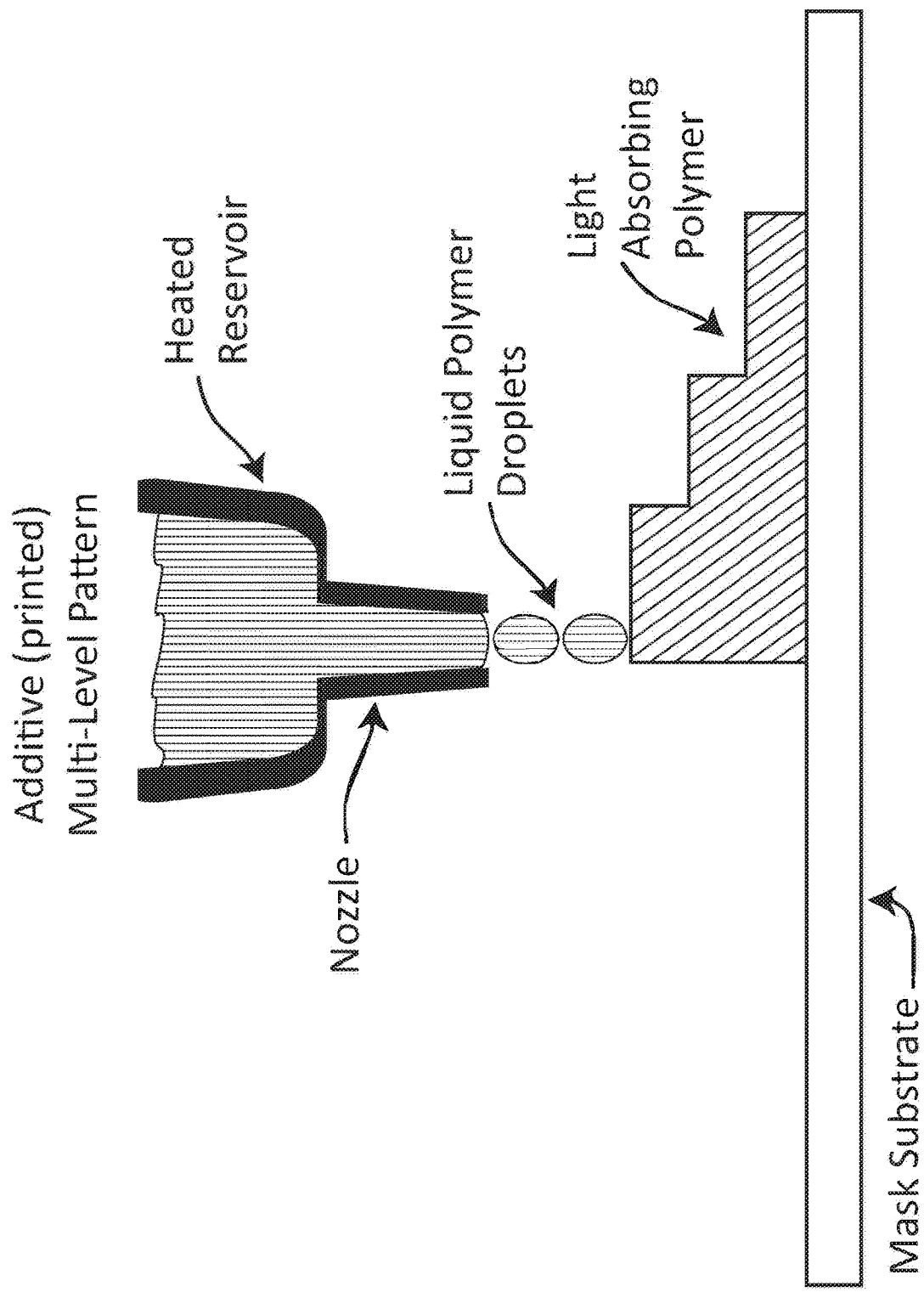
FIG. 11 is a cross sectional view showing an additive process to form a stepped pattern in the light absorbing polymer using a printer that provides liquid polymer droplets.

Other methods of additive manufacture, such as chemical vapor deposition through a mask or on a previously deposited patterned precursor layer on the mask substrate, can be used to make multi-tone amplitude photomasks. Additive printing, such as with a nozzle that provides liquid polymer droplets, can be used to form the light absorbing polymer stepped pattern, as shown in FIG. 11. Other metal, dielectric, or polymer materials, two dimensional materials, such as graphene, and other materials with desired transmittivities or reflectivities can also be used.

While several embodiments, together with modifications thereof, have been described in detail herein and illustrated in the accompanying drawings, it will be evident that various further modifications are possible without departing from the scope of the invention as defined in the appended claims. Nothing in the above specification is intended to limit the invention more narrowly than the appended claims. The examples given are intended only to be illustrative rather than exclusive.

What is claimed is:

1. A multi-tone amplitude photomask comprising: a mask substrate having a pattern on a surface of the mask substrate, wherein the pattern defines a channel and includes a plurality of layers of material, wherein each layer of material provides a different intensity of light when a light source shines light on the pattern.

2. The multi-tone amplitude photomask according to claim 1, wherein the number of layers of material is least three layers of material.

3. The multi-tone amplitude photomask according to claim 1, wherein the pattern includes a layer of a patterned polymer on the mask substrate and wherein the pattern in the polymer includes a first portion having a first thickness and a second portion having a second thickness.

4. The multi-tone amplitude photomask according to claim 1, wherein the pattern includes a plurality of differently patterned layers of a polymer on the mask substrate.

5. The multi-tone amplitude photomask according to claim 1, wherein the pattern includes:
a first blanket layer of material on the mask substrate;
a second blanket layer of material on the first blanket layer of material, wherein the first blanket layer and the second blanket layer arranged to form the pattern, wherein the first blanket layer includes a first pattern and the second blanket layer includes a second pattern different from the first pattern.

6. The multi-tone amplitude photomask according to claim 5, wherein the pattern includes a first region having none of the first layer and none of the second layer, a second region having the first layer and none of the second layer, and a third region having both the first layer and the second layer.

7. The multi-tone amplitude photomask according to claim 1, wherein the pattern on the surface of the mask substrate includes:
at least one material on the surface of the mask substrate;
a first resist disposed on the at least one material wherein a first opening in the resist extends completely through the first resist and wherein the first opening includes a first region along the surface.

8. The multi-tone amplitude photomask according to claim 7, wherein the pattern on the surface of the mask substrate includes a first etched pattern in the at least one material defined by the first opening wherein the first etched pattern extends only part way through the at least one material and leaving a remaining portion of the at least one material.

9. The multi-tone amplitude photomask according to claim 8, wherein the pattern on the surface of the mask substrate includes a second resist disposed on the at least one material, wherein a second opening in the second resist extends completely through the second resist, and wherein the second opening extends above the first region.

10. The multi-tone amplitude photomask according to claim 9, the pattern on the surface of the mask substrate includes a second etched pattern in the at least one material defined by the second opening, wherein the second etched pattern extends at least partially through a remaining portion of the at least one material to provide the pattern in the at least one material on the mask substrate, and wherein the second etch pattern is aligned to the first etch pattern.

11. The multi-tone amplitude photomask according to claim 7, wherein the at least one material includes a first material and a second material, wherein the first material has a first etch characteristic and the second material has a second etch characteristic that is different from the first etch characteristic, wherein the first and the second etch characteristics allow for etching all the way through the first material without substantially etching the second material, and etching all the way through the second material without substantially etching the first material.

12. A multi-tone amplitude photomask comprising:
a mask substrate; and
a channel on top of the substrate, wherein the channel is formed from a plurality of layers of material, and wherein each layer has an optical density that depends on the material characteristic and layer thickness.

13. A multi-tone amplitude photomask according to claim 12, wherein the channel has rounded edges.

14. A multi-tone amplitude photomask according to claim 12, wherein a second channel is arranged above, and substantially orthogonal to, the channel.

15. A multi-tone amplitude photomask according to claim 12, wherein the channel has curved sidewalls.

16. A multi-tone amplitude photomask according to claim 12, wherein one of the plurality of layers of material is an etch stop layer.

17. A multi-tone amplitude photomask according to claim 16, wherein the etch stop layer includes a plurality of openings.

18. A multi-tone amplitude photomask according to claim 12, wherein the channel is sized and configured to carry a liquid.

19. A multi-tone amplitude photomask mask substrate comprising: a pattern on a surface of the mask substrate, wherein the pattern defines a channel and includes a plurality of layers of material, wherein each layer of material provides a different intensity of light when a light source shines light on the pattern.

20. A multi-tone amplitude photomask mask substrate according to claim 1, wherein the number of layers of material is least three layers of material.

* * * * *